United States Patent [19]
Goenka et al.

[11] Patent Number: 5,968,386
[45] Date of Patent: Oct. 19, 1999

[54] METHOD FOR PROTECTING ELECTRONIC COMPONENTS

[75] Inventors: Lakhi Nandlal Goenka, Ann Arbor; Delin Li, Dearborn Heights; Daniel Phillip Dailey, West Bloomfield; Charles Frederick Schweitzer, Novi; Michael Bednarz, Canton; Brenda Joyce Nation, Troy, all of Mich.

[73] Assignee: Ford Motor Company, Dearborn, Mich.

[21] Appl. No.: 08/993,112

[22] Filed: Dec. 18, 1997

[51] Int. Cl.⁶ .................................................. H05B 1/00
[52] U.S. Cl. ............................................................ 219/209
[58] Field of Search ...................... 174/52.2, 52.3, 174/52.4, 65 R; 361/752; 219/209

[56] References Cited

U.S. PATENT DOCUMENTS

| | | | |
|---|---|---|---|
| 3,679,810 | 7/1972 | Nutt | 174/16 R |
| 3,909,504 | 9/1975 | Browne | 174/52 PE |
| 4,054,428 | 10/1977 | Foltz | 55/33 |
| 4,085,286 | 4/1978 | Horsma et al. | 174/92 |
| 4,793,180 | 12/1988 | Stewart et al. | 73/335 |
| 4,855,867 | 8/1989 | Gazdik et al. . | |
| 4,977,009 | 12/1990 | Anderson et al. | 429/76 |
| 4,999,741 | 3/1991 | Tyler . | |
| 5,015,803 | 5/1991 | Mahulikar | 174/52.4 |
| 5,041,395 | 8/1991 | Steffen | 437/206 |
| 5,166,864 | 11/1992 | Chitwood et al. . | |
| 5,270,493 | 12/1993 | Inoue et al. | 174/253 |
| 5,285,559 | 2/1994 | Thompson et al. . | |
| 5,317,478 | 5/1994 | Sobhani . | |
| 5,508,888 | 4/1996 | Craps | 361/773 |
| 5,739,463 | 4/1998 | Diaz et al. | 174/35 R |
| 5,759,653 | 6/1998 | Collette et al. | 428/35.9 |
| 5,766,464 | 6/1998 | Cambell | 210/251 |
| 5,852,879 | 12/1998 | Schumaier | 34/80 |

*Primary Examiner*—Teresa Walberg
*Assistant Examiner*—Daniel Robinson
*Attorney, Agent, or Firm*—Leslie C. Hodges

[57] ABSTRACT

An an electronic circuit having improved protection against harsh environments, a preferred embodiment thereof including: a substrate 10 having a top surface 12; an electronic component 14 attached to the top surface of the substrate; a plastic and metal foil laminated barrier 16 having an outer periphery 18 thereabout, the outer periphery being sealably attached to the top surface 12 of the substrate so as to define a closed pocket 20 between the top surface 12 and the barrier 16 within which the electronic component 14 is enclosed; and a desiccant element 50. The desiccant element 50 includes: a case 51 having an internal chamber, an inlet orifice 58, and an outlet orifice 59, wherein the inlet and outlet orifices are each in communication with the internal chamber; a predetermined amount of desiccant material 53 contained within the internal chamber; a normally-open interior valve 54 situated between the inlet orifice 58 and the internal chamber; a normally-closed exterior valve 56 situated between the outlet orifice 59 and the internal chamber; and heating means 52 for selectably heating the desiccant material 53 preferably above a regeneration temperature thereof. The desiccant element 50 is situated such that at least the interior orifice 54 thereof is sealably enclosed within the closed pocket 20.

19 Claims, 3 Drawing Sheets

METHOD FOR PROTECTING ELECTRONIC COMPONENTS

BACKGROUND OF THE INVENTION

1. Field of the Invention

The present invention relates generally to electronic circuits, and more particularly to a method for protecting electronic circuits against harsh environments.

2. Disclosure Information

Many environments in which electronic circuits are used present harsh conditions which are detrimental to the performance and/or life expectancy of the circuit components. For example, in some automotive applications circuit components must be able to withstand severe vibrations, drastic temperature fluctuations (e.g., between −40° C. and 125° C.), corrosive and/or particle-laden exhaust fumes, high atmospheric moisture content, and so forth.

Various approaches are known for protecting electronic circuits from such harsh environmental conditions. One such approach is to provide a cover or housing of some sort around at least some portion of the circuit. Another approach is to pot the whole circuit or portions thereof in an epoxy, silicone, or other compound.

However, these and other previously known approaches often suffer from one or more drawbacks. For example, potting a circuit may protect it from gross exposure to water and other harmful fluids, but typically does not protect against gradual seepage of such fluids through the potting material and into the electronics over time. Likewise, providing a cover or housing over or about the electronics may suffer the same disadvantage. Furthermore, even if a cover or housing is generally well sealed against water penetration, over time moisture may nonetheless permeate into and accumulate in the interior of such covers or housings, which may detrimentally affect the functioning and/or useful life of the circuit.

It would be desirable, therefore, to provide some means for protecting an electronic circuit against the above-mentioned harmful environmental conditions without the aforementioned drawbacks.

SUMMARY OF THE INVENTION

The present invention overcomes the disadvantages of prior art approaches by providing an electronic circuit having improved protection against harsh environments. A preferred embodiment of the present invention comprises: a substrate having a top surface; an electronic component attached to the top surface of the substrate; a plastic and metal foil laminated barrier having an outer periphery thereabout, the outer periphery being sealably attached to the top surface of the substrate so as to define a closed pocket between the top surface and the barrier within which the electronic component is enclosed; and a desiccant element. The desiccant element comprises: a case having an internal chamber, an inlet orifice, and an outlet orifice, wherein the inlet and outlet orifices are each in communication with the internal chamber; a predetermined amount of desiccant material contained within the internal chamber; a normally-open interior valve situated between the inlet orifice and the internal chamber; a normally-closed exterior valve situated between the outlet orifice and the internal chamber; and heating means for selectably heating the desiccant material above its regeneration temperature. The desiccant element is situated such that at least the interior orifice thereof is sealably enclosed within the closed pocket.

It is an object and advantage that the present invention offers improved protection to electronic circuits against harsh environmental conditions.

Another advantage is that a preferred embodiment of the present invention offers regeneratable hygrometric protection to electronic circuits.

These and other advantages, features and objects of the invention will become apparent from the drawings, detailed description and claims which follow.

DETAILED DESCRIPTION OF THE PREFERRED EMBODIMENTS

Figure 1:
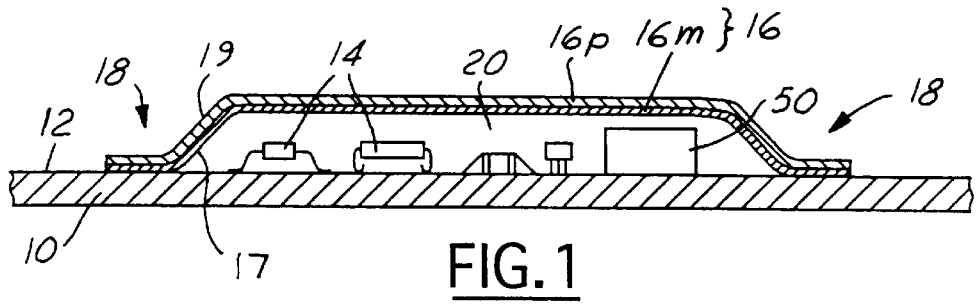
FIGS. 1–2 are elevation section views of a first embodiment according to the present invention.

Referring now to the drawings, FIG. 1 shows an electronic circuit having improved protection against harsh environments according to a first embodiment of the present invention. The circuit comprises: a substrate 10 having a top surface 12; an electronic component 14 attached to the top surface 12 of the substrate 10; a plastic and metal foil laminated barrier 16 having an outer periphery 18 thereabout, with the outer periphery 18 being sealably attached to the top surface 12 of the substrate 10 so as to define a closed pocket 20 between the top surface 12 and the barrier 16 within which the electronic component 14 is enclosed; and a desiccant element 50 disposed within the pocket 20.

Figure 3:
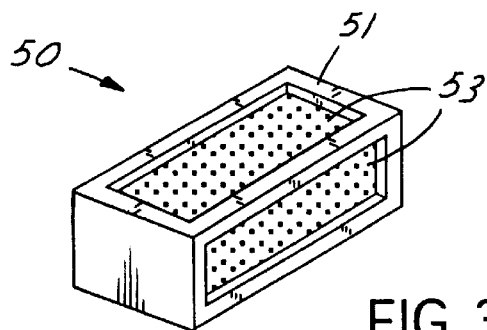
FIG. 3 is a perspective view of a desiccant element according to a first embodiment of the present invention.

The desiccant element 50 comprises a predetermined amount of desiccant material 53 contained within a case 51, as illustrated by FIG. 3. The case 51 may comprise a rigid housing made of plastic, metal, ceramic, or some other material with apertures, screens, or other means therein for allowing the desiccant material 53 to absorb through the case 51 any moisture present within the pocket 20, while preventing the desiccant material 53 from spilling out of the case 51. The element 50 might alternatively comprise a fine-mesh cloth bag or a water-permeable membranous pouch with granular desiccant material contained therein; various other embodiments are also possible. The desiccant material 53 may be any type of suitable desiccant which can be packaged within the case 51, preferably in granular form. Examples of suitable materials 53 include (but are not limited to) silica gel, $SiO_2$, $CuSO_4$, $CaSO_4$, $CaCl_2$, $ZnBr_2$, $ZnCl_2$, NaOH, $CaBr_2$, KOH, $Al_2O_3$, CaO, BaO, $Mg(ClO)_4$, and $P_2O_5$.

The desiccant element 50 may be attached to the top surface 12 of the substrate 10, to the interior surface of the barrier 16, or to both Alternatively, rather than being attached to any adjacent structure, it may instead be sandwiched between the top surface 12 of the substrate 10 and the interior surface of the barrier 16 so as to be held in place therebetween.

Figure 2:
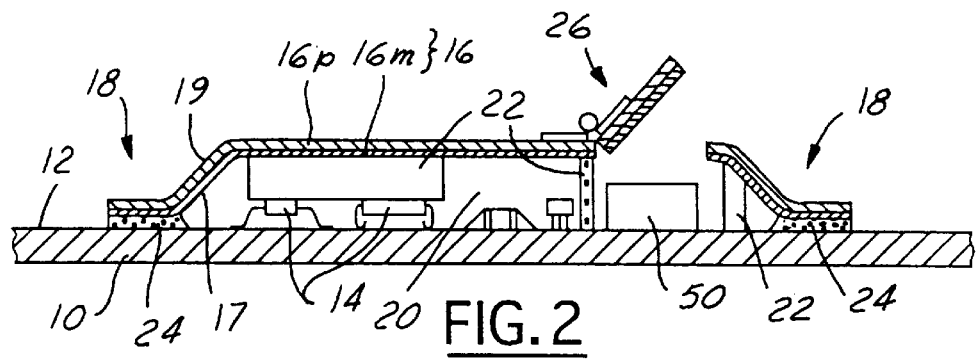

To provide additional structural support and protection, the circuit may further comprise one or more support members 22, as shown in FIG. 2. Each support member 22 is situated within the closed pocket 20 so as to have a first end contiguous with the top surface 12 of the substrate 10 or a top surface of an electronic component 14 (or both), and a second end contiguous with the interior surface 17 of the barrier 16. Such supports 22 are preferably made of foam, plastic, or some other material which imparts additional crush-resistance and/or protection from vibration to the electronic circuit.

The barrier 16 is a lamination of at least one layer of rigid or semi-rigid plastic 16p and at least one layer of metal foil 16m. The plastic 16p and metal foil 16m may be sheets that are adhered or otherwise bonded together, or they may be formed by overmolding the plastic onto one or both surfaces of the metal foil(s) (e.g., by placing a metal foil into a mold and then injecting molten plastic thereon or therearound). Other well known methods are also available for providing the plastic and metal foil laminated barrier 16. Although in a preferred embodiment the interior surface 17 of the barrier 16 is defined by a metal foil 16m and the exterior surface 19 is defined by a plastic layer 16p, as shown in FIGS. 1–2, 4, and 6–7, it is likewise possible that the interior surface 17 be defined by a layer of plastic 16p and/or that the exterior surface 19 be defined by a metal foil 16m.

As illustrated in FIG. 2, the barrier may further comprise a door means 26 sealably disposed therein for permitting access into the pocket 20 for removal and replacement of the desiccant element 50. The door means 26 preferably includes an access door and means for sealably attaching the door to the barrier in a substantially watertight closed position. The door means 26 may include an attachable hinge or molded-in hinge joint for pivotably connecting the door to the barrier.

Figure 4:
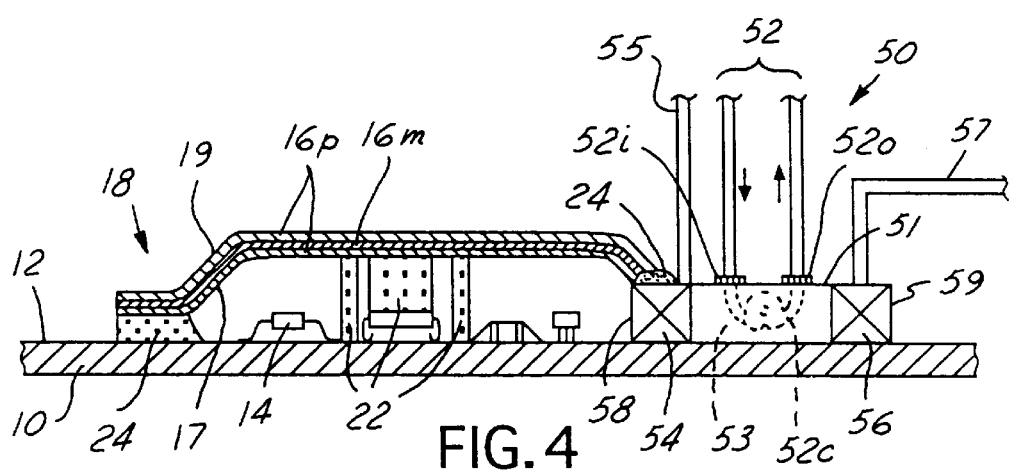
FIG. 4 is an elevation section view of a second, preferred embodiment according to the present invention.
Figure 6:
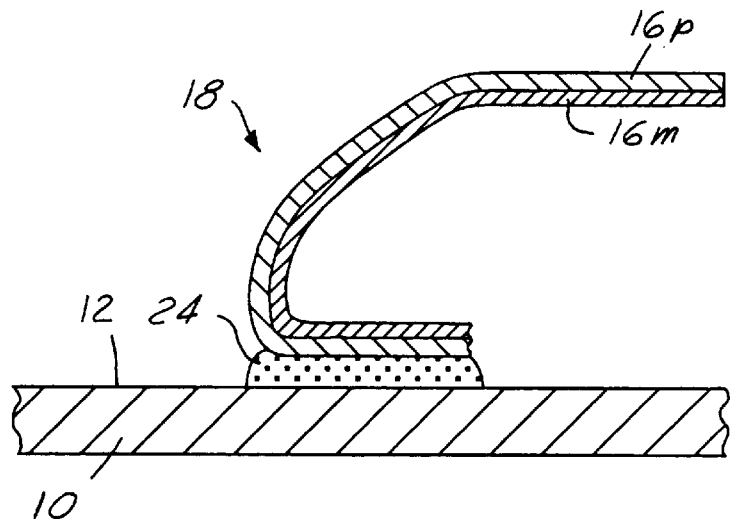
FIGS. 6–7 are elevation section views showing methods for sealably attaching a barrier periphery to a substrate top surface according to the present invention.
Figure 7:
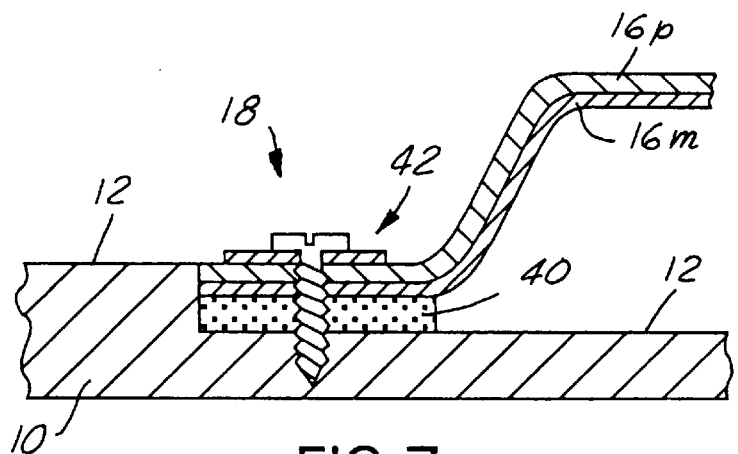

The outer periphery 18 of the barrier 16 may be sealably attached to the top surface 12 of the substrate 10 in a variety of ways, so as to sealably enclose the electronic component 14 and desiccant element 50 within the closed pocket 20. One way is to ultrasonically bond the outer periphery 18 to the substrate 10 (as illustrated in FIG. 1), while another approach is to adhesively bond the periphery to the substrate using a sealable adhesive (as illustrated in FIGS. 2, 4, and 6). Another method is to use a gasket means 40 sandwiched between the top surface 12 and the periphery 18 in conjunction with a fastening means 42 for sealably attaching the barrier periphery to the substrate. The gasket means 40 may comprise a gasket made of silicone, neoprene, or other water-sealable material, whether applied in solid form (e.g., pre-molded) or in a liquid/gelatinous/extrudable form (e.g., room-temperature-vulcanizing silicone caulk). The gasket means 40 should typically define a closed loop generally conforming to the shape of the outer periphery 18. The fastening means 42 may include washer and screw arrangements (as illustrated in FIG. 7), nut-and-bolt combinations, clips, snap-fit joints, hook-and-loop fasteners, adhesives, and the like. This gasket means/fastening means approach has the advantage that the barrier 16 may be removed and replaced as desired, such as when repairs or tests need to be conducted upon the electronics, or when replacing the desiccant element 50 if no door means 26 is provided. Whatever method is used, it is preferred that the attachment method provide a substantially water-tight seal about the periphery of the closed pocket 20.

With the laminated barrier 16 sealably attached to the substrate 10 and enclosing the electronic component(s) 14 and desiccant element 50 therein, improved mechanical, vibrational, and hygrometric protection is provided to the component(s) 14 and the associated circuit elements and interconnects (e.g., solder joints, circuit traces, jumper wires, etc.). Protection may be further enhanced by constructing the barrier 16 using one or more rigid or semi-rigid plastic layers 16p therein. The rigidity of the layer(s) 16p will depend upon the resin material used, the thickness of each layer, the use of ribs or other molded-in or attached structural members, the geometry of the barrier, etc. For example, a typical barrier 16 may comprise a 0.125- to 0.250-inch-thick sheet of acrylonitrile-butadiene-styrene (ABS), polyetherimide, polyethersulfone, or some other polymer, to which a 0.01- to 0.05-inch-thick sheet of aluminum foil has been attached. Additional protection is offered by providing the support members 22 described above, which may be constructed out of styrene foam, for example.

With the periphery 18 of the barrier being sealably attached to the substrate 10, the closed pocket 20 may be made generally water-tight. The electronics may be further protected from humidity by the metal foil 16m; whereas some microleakage of moisture may occur through the plastic layer 16p, substantially no water may pass through the metal foil 16m. (The metal foil 16m may also provide some degree of EMI protection for the electronics.) Additionally, the desiccant element 50 serves to absorb any moisture which might find its way into the pocket 20, such as by seepage past any breaks in the seal about the door means 26 or through microfissures in ultrasonically welded outer periphery-to-substrate joints and seams. The element 50 can be periodically removed and replaced with a new element 50 through the door means 26.

A second, preferred embodiment of the present invention is illustrated in FIG. 4. Like the first embodiment, the present embodiment includes a substrate 10 having a top surface 12; an electronic component 14 attached to the top surface 12 of the substrate 10; a plastic and metal foil laminated barrier 16 having an outer periphery 18 sealably attached to the top surface 12 of the substrate 10 so as to define a closed pocket 20 therebetween within which the electronic component is enclosed; and a desiccant element 50. However, whereas the entire desiccant element 50 in the first embodiment was sealably enclosed within the closed pocket 20, only a portion of the element 50 in the present embodiment is so enclosed. Furthermore, the present element 50 includes additional structure not necessarily found in that of the previous embodiment.

As can be seen from FIG. 4, the desiccant element 50 of the present embodiment comprises: a case 51 having an internal chamber, an inlet orifice 58, and an outlet orifice 59, wherein the inlet and outlet orifices are each in communication with the internal chamber; a predetermined amount of desiccant material 53 contained within the internal chamber; a normally-open interior valve 54 situated between the inlet orifice 58 and the internal chamber; a normally-closed exterior valve 56 situated between the outlet orifice 59 and the internal chamber; and heating means 52 for selectably heating the desiccant material 53 to a temperature preferably above a regeneration temperature thereof. The desiccant element 50 is situated such that at least the interior orifice 54 thereof is sealably enclosed within the closed pocket 20.

Figure 5:
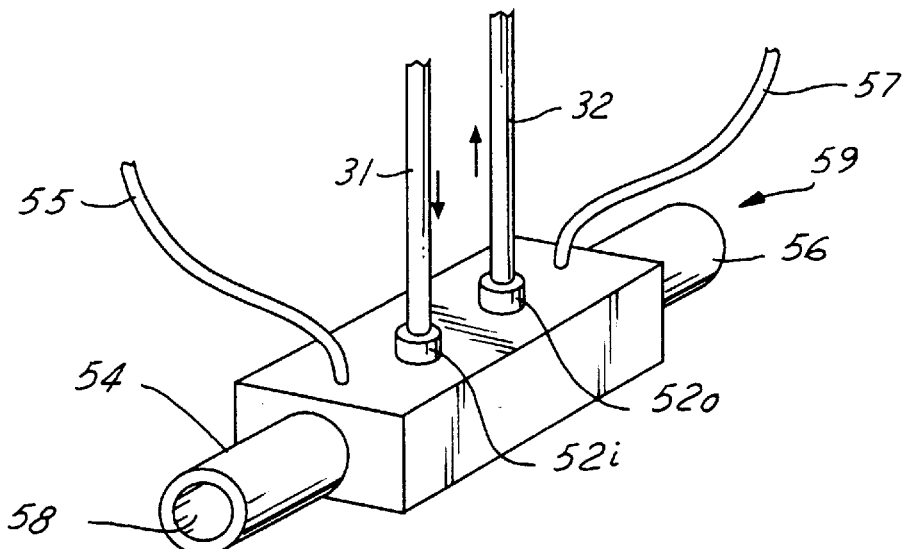
FIG. 5 is a perspective view of a desiccant element according to a second embodiment of the present invention.

As illustrated in FIGS. 4 and 5, the heating means 52 may comprise a heat conducting conduit portion 52c disposed within and/or about the case 51 in direct or indirect thermal contact with the desiccant material 53, wherein the heat conducting conduit portion 52c has inlet and outlet ports 52i/52o capable of sealable fluid communication with respective inlet and outlet conduits 31/32 as shown. The inlet and outlet conduits 31/32 may be sealably connected at one end to their respective inlet and outlet ports 52i/52o (via clamps, o-rings, fittings, etc.) and at the other end to a circulating pump. A heated fluid (e.g., radiator fluid, water, oil, exhaust gas, etc.) may be circulated through the inlet 31/52i, into the conducting portion 52c, and out through the outlet 32/52o so as to elevate the desiccant 53 to a temperature preferably at or above its regeneration temperature. Alternatively, the heating means 52 may comprise an electric resistance heating element within and/or about the case 51 which may be electrically activated by a power source external to the circuit.

The circuit may further include means 60 for selectably switching the interior valve 54, the exterior valve 56, and the heating means 52 between (1) a normal operating condition and (2) a regenerating condition. In the normal operating condition, the interior valve 54 is open, the exterior valve 56 is closed, and the heating means 52 is de-activated (i.e., not supplying heat). In this condition, the desiccant material 53 is in water-absorbable communication with the interior of the pocket 20, so that the material 53 may absorb moisture therefrom and keep the pocket 20 desirably dry. When the moisture content of the desiccant material 53 is above a predetermined level, or whenever otherwise desired, the circuit may be switched to the regenerating condition. In this condition, the interior valve 54 is closed, the exterior valve 56 is open, and the heating means 52 is activated, thus closing off communication between the desiccant material 53 and the interior of the pocket 20 and opening up water-releasable communication between the material 53 and the outside environment. With the heating means 52 activated, the desiccant material 53 may be heated up preferably above its regeneration temperature so as to liberate the previously absorbed moisture from the material 53 out to the atmosphere. Once the moisture content of the material 53 is below a predetermined level, or whenever otherwise desired, the circuit may be switched back to the normal operating condition, wherein the desiccant element 50 may once again work to absorb moisture from the interior of the closed pocket 20. With these two conditions switchably provided, the present embodiment offers the advantage of having a regeneratable desiccant element.

Figure 8:
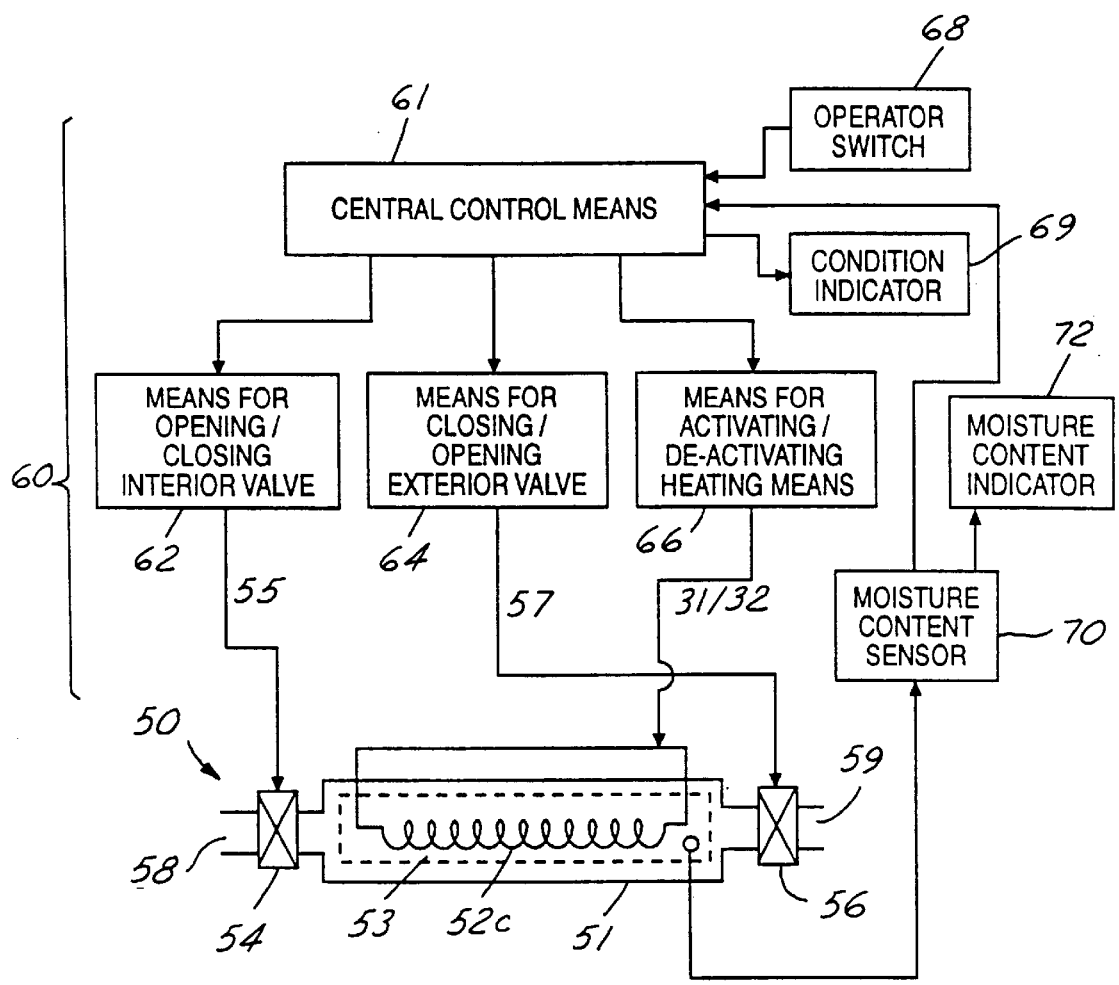
FIG. 8 is a schematic diagram of a means for selectably switching between two conditions according to a second embodiment of the present invention.

The means 60 for selectably switching may comprise mechanical, electrical, pneumatic (i.e., pressure or vacuum), fluidic, hydraulic, microprocessor, and/or other means 62/64/66 for physically opening and closing the inlet and outlet valves 54/56 and for activating and de-activating the heating means 52. For example, as illustrated in FIGS. 4, 5, and 8, the means 60 may comprise vacuum lines 55/57 connected upstream to vacuum means 62/64 (e.g., portions of an automotive engine vacuum system) for opening and closing the interior and exterior valves 54/56 as needed, and inlet and outlet fluid lines 31/32 connected upstream to a fluid circulating means 66 (e.g., an automotive engine radiator fluid pump) for activating and de-activating a heating conduit 52c within the case 51. A central control means 61 (e.g., a microprocessor or control circuit) may be used to coordinate the actuation of the means 62/64/66 in order to selectably switch between the normal operating and regenerating conditions. The control means 61 may include microprocessor or other means for automatically switching the circuit back-and-forth between the two conditions based on whether the desiccant moisture content level is above or below a predetermined threshold value (e.g., 85% of maximum absorptive capacity). The central control means 61 may also include an operator switch 68 which may be used by a human operator to selectably switch back-and-forth between the two conditions as desired, and/or a condition indicator 69 which indicates which of the two conditions the circuit is presently in.

The circuit may further comprise a moisture content sensor 70 within the case 51 in communication with the desiccant material 53 so that the hygrometric condition of the material 53 may be sensed. This sensor 70 may in turn be connected to an indicator 72 for indicating the hygrometric condition of the desiccant, and/or it may be connected to the means 60 for selectably switching.

Many different types of desiccant material 53 may be used in either embodiment of the present invention, and may be selected based on such factors as cost, regeneration temperature, regeneration efficiency, expected service life, and the like. For example, a common silica gel material having a typical regeneration temperature of 160° C. may be more cost effective for most applications than a $CaSO_4$ material having a 250° C. regeneration temperature.

Various other modifications to the present invention will, no doubt, occur to those skilled in the art to which the present invention pertains. For example, although the barrier 16 is described herein as being attached to a "top" surface 12 of the substrate 10, the designation of "top" has been made arbitrarily, since either side of a substrate 10 may be deemed as the "top" surface. Thus, the present invention also covers application to what might appear to be, or what might otherwise be designated as, a "bottom" surface of a substrate 10. Also, it should be apparent that the "thermal contact" referred to above between the heat conducting conduit portion 52c and the desiccant 53 does not require direct contact therebetween; the conduit 52c and desiccant 53 may be indirectly in contact with one another with one or more intervening, thermally conductive elements (e.g., heat pipes) interposed therebetween. Moreover, it should be apparent that the substrate 10 as used herein is not limited to conventional, flat, planar FR-4 epoxy/glass substrates, but may also include housings, covers, shrouds, panels, doors, and any other member providing a surface—whether planar or non-planar—on which electronic components may be mounted; such substrate may be rigid or flexible, and may be constructed of polymer, metal, ceramic, or any combination thereof. Also, it should be understood that the term "desiccant" may refer to any material having hygroscopic characteristics. Additionally, although it is preferable that the desiccant material of the preferred embodiment be heated to a temperature at or above its regeneration temperature, those skilled in the art will recognize that any increase in temperature—even to a temperature below the material's regeneration temperature—will provide some regenerative effect (i.e., moisture will be liberated therefrom). It is the following claims, including all equivalents, which define the scope of the present invention.

What is claimed is:

1. An electronic circuit having improved protection against harsh environments, comprising:

a substrate having a top surface;

an electronic component attached to said top surface of said substrate;

a plastic and metal foil laminated barrier having an outer periphery thereabout, said outer periphery being sealably attached to said top surface of said substrate so as to define a closed pocket between said top surface and said barrier within which said electronic component is enclosed; and a desiccant element comprising:

a case having an internal chamber, an inlet orifice, and an outlet orifice, wherein said inlet and outlet orifices are each in communication with the internal chamber;

a predetermined amount of desiccant material contained within the internal chamber;

a normally-open interior valve situated between the inlet orifice and the internal chamber;

a normally-closed exterior valve situated between the outlet orifice and the internal chamber; and heating means for selectably heating said desiccant material;

wherein said desiccant element is situated such that at least the interior orifice thereof is sealably enclosed within the closed pocket.

2. An electronic circuit according to claim 1, wherein said barrier comprises at least one layer of plastic and at least one layer of metal foil.

3. An electronic circuit according to claim 1, wherein said desiccant element is attached to at least one of the substrate and the barrier.

4. An electronic circuit according to claim 1, wherein said desiccant element is sandwiched between the top surface of said substrate and said barrier.

5. An electronic circuit according to claim 1, further comprising at least one support member contiguous at a first end with the top surface of said substrate and contiguous at a second end with said barrier.

6. An electronic circuit according to claim 1, further comprising at least one support member contiguous at a first end with a top surface of said electronic component and contiguous at a second end with said barrier.

7. An electronic circuit according to claim 1, wherein said outer periphery is ultrasonically bonded to the top surface of said substrate so as to sealably enclose said electronic component and said desiccant element within the closed pocket.

8. An electronic circuit according to claim 1, wherein said outer periphery is adhesively bonded to the top surface of said substrate so as to sealably enclose said electronic component and said desiccant element within the closed pocket.

9. An electronic circuit according to claim 1, further comprising:

gasket means sandwiched between the top surface of said substrate and the outer periphery of said barrier; and fastening means cooperating with said gasket means for attaching the outer periphery of said barrier to the top surface of said substrate.

10. An electronic circuit according to claim 1, further comprising a door means sealably disposed in said barrier for permitting access into the pocket for removal and replacement of said desiccant element.

11. An electronic circuit according to claim 1, wherein said desiccant element comprises a predetermined amount of desiccant material contained within a case, wherein said desiccant material may absorb through said case any moisture present within the pocket.

12. An electronic circuit according to claim 1, wherein said desiccant material is selected from the group consisting of silica gel, $SiO_2$, $CuSO_4$, $CaSO_4$, $CaCl_2$, $ZnBr_2$, $ZnCl_2$, NaOH, $CaBr_2$, KOH, $Al_2O_3$, CaO, BaO, $Mg(ClO)_4$, and $P_2O_5$.

13. An electronic circuit according to claim 1, further including means for selectably switching said interior valve, said exterior valve, and said heating means between:

a normal operating condition, wherein said interior valve is open, said exterior valve is closed, and said heating means is de-activated; and a regenerating condition, wherein said interior valve is closed, said exterior valve is open, and said heating means is activated.

14. An electronic circuit according to claim 13, wherein said means for selectably switching includes at least one of:

a microprocessor means for automatically switching back-and-forth between the normal operating condition and the regenerating condition based on whether a desiccant moisture content level is above or below a predetermined threshold value;

an operator switch which may be used by a human operator to selectably switch back-and-forth between the normal operating and regenerating conditions as desired; and a condition indicator which indicates which of the normal operating and regenerating conditions the circuit is in.

15. An electronic circuit according to claim 1, wherein said heating means comprises:

an inlet port and an outlet port, each attached to said case and capable of sealable fluid communication with respective inlet and outlet conduits; and a heat conducting conduit portion disposed within said case in thermal contact with said desiccant material, said portion being in sealable fluid communication with each of said inlet and outlet ports.

16. An electronic circuit according to claim 1, wherein said heating means comprises an electric heating element disposed within or about said case in thermal contact with said desiccant material.

17. An electronic circuit according to claim 1, further comprising a moisture content sensor disposed within said case in communication with said desiccant material.

18. An electronic circuit according to claim 17, wherein said moisture content sensor is connected to at least one of an indicator for indicating the hygrometric condition of said desiccant material, and said means for selectably switching between said normal operating condition and said regenerating condition.

19. An electronic circuit having improved protection against harsh environments, comprising:

a substrate having a top surface;

an electronic component attached to said top surface of said substrate;

a plastic and metal foil laminated barrier having an outer periphery thereabout, said outer periphery being sealably attached to said top surface of said substrate so as to define a closed pocket between said top surface and said barrier within which said electronic component is enclosed; and a desiccant element comprising:

a case having an internal chamber, an inlet orifice, and an outlet orifice, wherein said inlet and outlet orifices are each in communication with the internal chamber;

a predetermined amount of desiccant material contained within the internal chamber;

a normally-open interior valve situated between the inlet orifice and the internal chamber;

a normally-closed exterior valve situated between the outlet orifice and the internal chamber;

heating means for selectably heating said desiccant material above a regeneration temperature thereof;

wherein said desiccant element is situated such that at least the interior orifice thereof is sealably enclosed within the closed pocket; and wherein said interior valve, said exterior valve, and said heating means may be switched between:

a normal operating condition, wherein said interior valve is open, said exterior valve is closed, and said heating means is de-activated; and a regenerating condition, wherein said interior valve is closed, said exterior valve is open, and said heating means is activated.

* * * * *